(12) United States Patent
Amreich

(10) Patent No.: US 9,870,331 B2
(45) Date of Patent: Jan. 16, 2018

(54) INTERFACE CIRCUIT

(71) Applicant: Infineon Technologies AG, Neubiberg (DE)

(72) Inventor: Peter Amreich, Grambach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/877,838

(22) Filed: Oct. 7, 2015

(65) Prior Publication Data

US 2017/0103032 A1 Apr. 13, 2017

(30) Foreign Application Priority Data

Oct. 7, 2014 (DE) .................. 10 2014 114 499

(51) Int. Cl.
*G06F 13/40* (2006.01)
*G06F 13/364* (2006.01)
*H03K 3/3565* (2006.01)
*H03F 3/45* (2006.01)
*G06F 1/32* (2006.01)
*G06F 13/42* (2006.01)

(52) U.S. Cl.
CPC .......... *G06F 13/364* (2013.01); *G06F 1/3287* (2013.01); *G06F 13/404* (2013.01); *G06F 13/4282* (2013.01); *H03F 3/45273* (2013.01); *H03K 3/3565* (2013.01); *H03F 2203/45544* (2013.01)

(58) Field of Classification Search
None
See application file for complete search history.

(56) References Cited

U.S. PATENT DOCUMENTS 6,243,776 B1    6/2001  Lattimore et al.
7,522,670 B2 *  4/2009  Carballo ............ H04L 25/0272
                                               375/257

FOREIGN PATENT DOCUMENTS

DE       102004027918 B4     6/2008

OTHER PUBLICATIONS

Office Action, in the German language, from counterpart German Application No. 102014114499.6, dated Apr. 29, 2015, 8 pp.

* cited by examiner

*Primary Examiner* — Cheng-Yuan Tseng
(74) *Attorney, Agent, or Firm* — Shumaker & Sieffert, P.A.

(57) ABSTRACT

Devices and methods are provided where a first signal and a second signal are received. The second signal may be a single-ended signal and may be selectively converted to a differential signal based on a type of the first signal.

20 Claims, 7 Drawing Sheets

INTERFACE CIRCUIT

RELATED APPLICATIONS

The instant application claims priority of German Patent Application No. 102014114499.6, which was filed on Oct. 7, 2014. The entire contents of the identified German Patent Application No. 102014114499.6 are hereby incorporated herein by reference.

BACKGROUND

Interface circuits may be used in electronic devices to transmit and receive signals, for example signals related to data transmission like data signals, clock signals or chip select signals. An example for such an interface circuit is a microsecond channel (MSC) interface. The MSC interface is an interface which may be used to couple a master device with one or more slave devices. The MSC interface uses, in a downstream direction (from master device to slave device) a chip select (CS) signal (selecting, for example, one of a plurality of slave devices), a serial data in signal (SI) and a clock signal (CLK), and, in an upstream direction (from slave device to master device) a serial data signal (SDO). The serial data and clock signals may be configured to be represented as single-ended signals or differential signals, in particular low voltage differential (LVD) signals, while, for example, the chip select signal according to the MSC interface is always a single-ended signal. Single-ended signals may be processed in the interface differently from differential signals. In some circumstances this may lead to timing problems, for example when sampling a single-ended signal like the chip select signal in an MSC system based on a differential signal, for example a differential clock signal in an MSC system.

DETAILED DESCRIPTION

Figure 1:
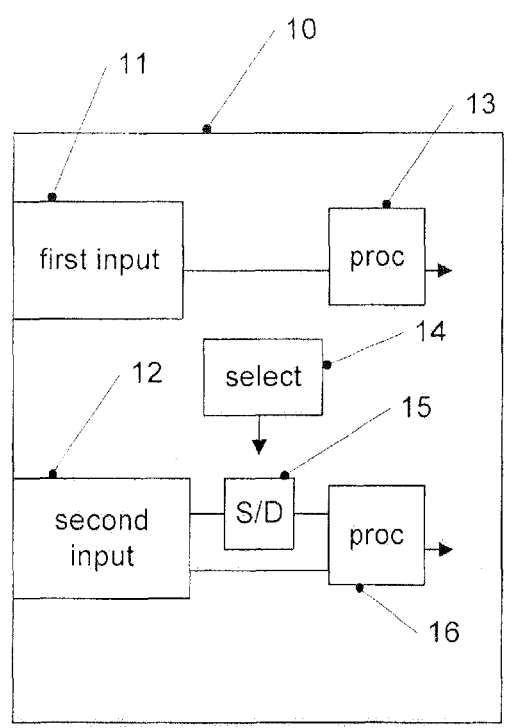
FIG. 1 illustrates a block diagram of an interface circuit according to an embodiment.

In the following, various embodiments will be described in detail referring to the attached drawings. It is to be noted that these embodiments are given only for illustration purposes and are not to be construed as limiting the scope of the present application.

Features of different embodiments described in the following or shown in the drawings may be combined with each other and are specifically noted otherwise. Also, a modification or variation described with respect to one of the embodiments may also applicable to other embodiments.

While embodiments are described and illustrated as comprising a plurality of features or elements, it is to be noted that this is not to be construed as indicating that all those features or elements are necessary for implementation of embodiments. Instead, in other embodiments some of the features or elements shown or described may be omitted and/or replaced by alternative features or elements. In other embodiments, additionally or alternatively additional features or elements to the ones described or illustrated may be provided. Any connection or couplings illustrated in the drawings or described herein may be a direct connection or coupling, i.e. a connection or coupling without additional intervening elements (for example a metal wire or part of a metal layer), or may be an indirect connection or coupling comprising one or more additional intervening elements, as long as the basic function of the connection or coupling, for example to transmit a certain kind of information or signal or to provide a certain control function, is essentially maintained.

Some embodiments relate to interface circuits. An interface circuit according to some embodiments may comprise a first signal input to receive a first signal and a second signal input to receive a second signal. The second signal may be a single-ended signal, while the first signal may either be a single-ended or a differential signal. In some embodiments, depending on whether the first signal is a single-ended signal or a differential signal, the second signal may be selectively converted to a differential signal prior to being further processed. For example, the second signal may be converted to a differential signal when the first signal also is a differential signal. The term "selectively performing a single-ended differential conversion" and the like also is intended to cover cases where the single-ended signal is always supplied to a single-ended-to-differential converter, but the output signal of the single-ended-to-differential converter is only used in the selected cases when the conversion is to be performed. Other techniques may also be employed.

Turning now to the drawings, in FIG. 1 a block diagram of an interface circuit 10 according to an embodiment is illustrated. The block diagram of FIG. 1 is to be regarded as schematic only, and elements shown may be arranged and coupled in a different manner than shown. Interface circuit 10 in embodiments may serve as an interface of an integrated circuit or other device. In some embodiments, interface circuit 10 may be an MSC interface circuit or part thereof.

In the embodiment of FIG. 1, interface circuit 10 comprises a first signal input 11 to receive a first signal and a second signal input 12 to receive a second signal. In the embodiment of FIG. 1, the second signal is a single-ended signal, while the first signal may selectively be a single-ended signal or a differential signal.

In the embodiment of FIG. 1, in case the first signal is a single-ended signal, the second signal (which is also a single-ended signal) may be processed by processing circuitry 16 in unaltered form, and the first signal may be processed by processing circuitry 13. For processing single-ended signals, processing circuitries 13, 16 may essentially have the same design, and thus cause the same or similar delays. In case the first input signal is a differential signal, a selection circuit 14 may control a single-ended-to-differential converter 15 to convert the second signal to a differential signal. The differential signals may be low voltage differential (LVD) signals. In this case, the first signal (in this case a differential signal) is processed by processing circuitry 13, and the second signal after the conversion by single-ended-to-differential converter 15 (also a differential signal) is processed by processing circuitry 16. Also for this case, processing circuitries 13, 16 may have a same or similar design. Processing circuitries 13, 16 in some embodiments may, for example, comprise amplifiers or buffers, just to give examples. Therefore, also in this case in some embodiments the delay caused by processing circuitries 13, 16 may be the same or similar, such that a delay difference may be limited to a delay difference caused by single-ended-to-differential converter 15. In some embodiments, in this way a delay between the signals may be reduced compared to some conventional solutions.

In some embodiments, the first signal may be a clock signal, and the second signal may be a signal to be sampled based on the clock signal, for example a chip select signal. In such embodiments, in some cases limiting the delay difference may help to ensure correct sampling. In other embodiments, other techniques may be employed.

Figure 2:
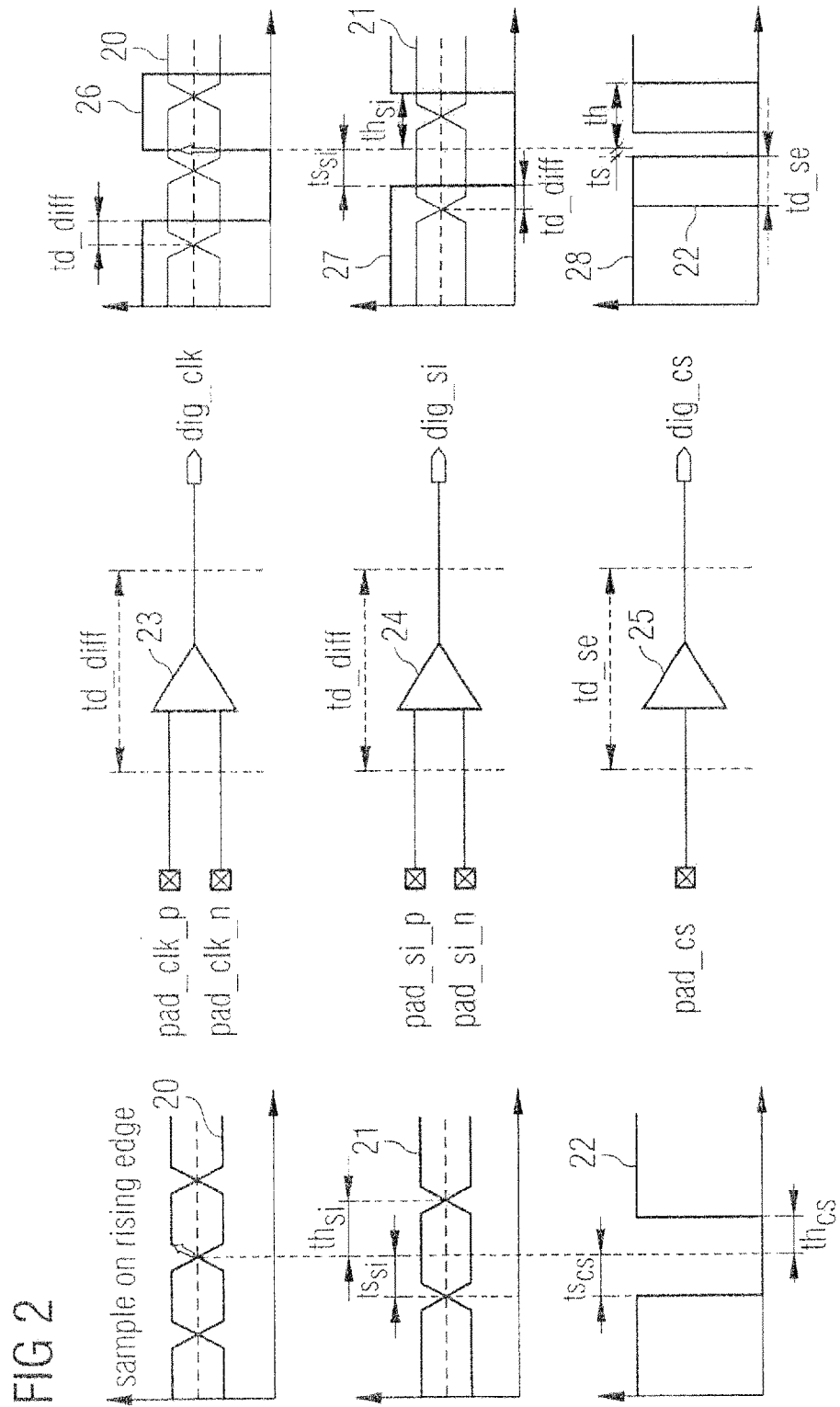
FIG. 2 illustrates signals and parts of devices for illustrating operation of some embodiments.

To illustrate issues associated with different delays for different signals further, FIG. 2 shows various example signals and devices. For example, an MSC interface circuit may receive a differential clock signal 20, a differential data signal 21 and a single-ended chip select signal 22. In an interface, differential clock signal 20 may be received at pads pad_clk_p and pad_clk_n and fed to a differential amplifier 23 to output a signal dig_clk. Differential amplifier 23 may cause a delay td_diff.

In a similar manner to differential clock signal 20, data signal 21 in the example of FIG. 2 is received at pads pad_se_p, pad_se_n and fed to a differential amplifier 24 to produce an output signal dig_si. Amplifier 24, for example a differential operational amplifier, introduces a time delay td_diff which may be approximately the same as the delay introduced by amplifier 23.

Single-ended signal 22 is received at a pad pad_cs and amplified by a single-ended amplifier 25 to produce a signal dig_cs. Single-ended amplifier 25 may introduce a time delay td_se that may be different from the time delay td_diff introduced by differential amplifiers 23, 24.

In FIG. 2, a time is designates a setup time, and a time th designates a hold time. A setup time is a time a signal is asserted prior to sampling, and a hold time is a time the signal remains after the sampling. If the setup time or the hold time falls below a respective threshold time, incorrect sampling may occur. In the example used in FIG. 2, data signal 21 and chip select signal 22 on a receiver side are to be sampled based on rising edges of clock signal 20. On the transmitter side (signals 20 to 22) the rising edge is approximately in the middle of a time period where signal 21 or 22 remains constant, which may lead to sufficiently large setup and hold times. As shown on the right side of FIG. 2, this may change due to the delays introduced by amplifiers 23 to 25. On the right side of FIG. 2, 26 shows an example for the signal dig_clk, which is offset from the original differential clock signal 20 by time difference td_diff. In a similar manner, curve 27 shows an example for signal dig_se, which is offset from the original data signal 21 again by td_diff. Curve 28 shows an example for signal dig_cs, which is offset from the original signal 22 by td_se, which in this example is larger than td_diff. As signals 26 and 27 experience the same delay, the sample and hold time essentially remain unchanged compared to the transmitter side (left side of FIG. 2). However, due to the different delays td_se and td_diff, sampling of signal 28 with signal 26 may be more prone to errors, as in the example the setup time is becomes very small.

Some embodiments, as already mentioned with respect to the embodiment of FIG. 1, may employ a selective single-ended differential conversion to mitigate such issues. In other embodiments, other techniques may be used.

Figure 3:
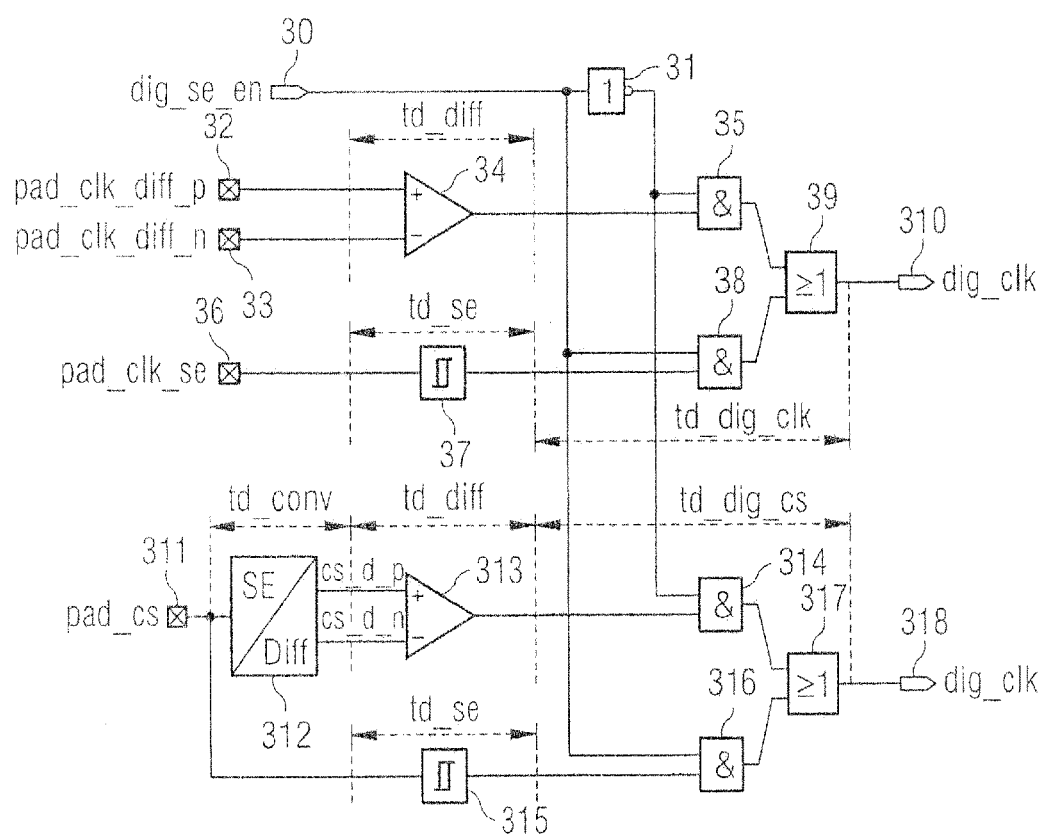
FIG. 3 is a diagram illustrating an interface circuit according to an embodiment.

In FIG. 3, an interface device according to a further embodiment is illustrated. The interface device illustrated in FIG. 3 may be an MSC interface or part thereof, but also may be used to implement other kinds of interfaces. The interface circuit illustrated in FIG. 3 may selectively receive a differential clock signal pad_clk_diff_p, pad_clk_diff_n at pads 32, 33 or a single-ended clock signal pad_clk_se at a pad 36. Furthermore, the interface circuit illustrated in FIG. 3 may receive a single-ended chip select signal pad_cs at a pad 311, which is an example for any kind of single-ended signal.

A signal dig_se_en fed to a terminal 30 may switch the interface circuit of FIG. 3 between a first mode of operation where the differential clock signal is received at pads 32, 33 and a second mode of operation where the single-ended clock signal is received at pad 36. The enable signal dig_se_en is fed to AND-gates 38 and 316 and additionally to an inverter 31 which feeds the inverted signal dig_se_en to AND-gates 35 and 314.

Next, the first mode of the embodiment of FIG. 3 where the clock signal is single-ended (i.e. fed to pad 36) will be discussed.

In this case, a logic zero is fed by inverter 31 to AND-gates 35 and 314, such that they always output a logic zero. Furthermore, a logic one is fed to AND-gates 38 and 316.

The single-ended clock signal provided to terminal 36 is fed, for example, to a Schmitt trigger 37 or other type of slicer having a defined threshold voltage and/or hysteresis. Schmitt trigger 37 introduces a delay td_se. The output of Schmitt trigger 37 is then fed to AND-gate 38. As the other input of end gate 38 is provided with a logic one, the signal from Schmitt trigger 37 is essentially forwarded by AND-gate 38 to an OR-gate 39 and output as signal dig_clk at a terminal 310.

The single-ended chip select signal received at pad 311 is fed to a Schmitt trigger 315 or similar device, e.g. slicer, which may be designed similarly to Schmitt trigger 37 and may introduce essentially the same delay td_se. The output of Schmitt trigger 315 is fed to AND-gate 316 and, as the other input of AND-gate 316 receives a logic one from terminal 30, is essentially forwarded to an OR gate 317 and output at terminal 318 as signal dig_cs. Therefore, both the single-ended clock signal and the single-ended chip select signal experience essentially the same delay td_se. Further, the subsequent elements 38, 39 on the one hand and 316, 317 on the other hand may correspond to each other, i.e. have similar or the same design and therefore also introduce similar delays. In other words, delays td_dig_clk and td_dig_cs may also be essentially the same. Consequently, signals dig_clk and dig_cs may have experienced essentially the same delay. This in embodiments may, for example, ensure a correct signal sampling of signal dig_cs based on signal dig_clk.

Next, the second mode of operation when the clock signal is a differential signal will be discussed. In this case, dig_se_en fed to terminal 30 may, for example, be a logic zero, such that a logic zero is fed to inputs of AND-gates 38 and 316, which, therefore, always output a value of zero. Furthermore, through inverter 31, a logic one is fed to AND-gates 35 and 314, such that output signals of differential amplifiers 34, 313 are essentially forwarded to OR-gates 39, 317 and from there (as AND-gates 38, 316 supply a zero) essentially forwarded to terminals 310, 318.

The differential clock signal, as already discussed, is received at pins 32 and 33 and amplified by the aforementioned differential amplifier 34, and the output signal of amplifier 34 is provided to AND-gate 35. This introduces a time delay td_diff. The subsequent elements again introduce the time delay td_dig_clk.

Moreover, the single-ended chip select signal received at pin 311 is fed to a single-ended-to-differential converter 312, converting the single-ended signal pad_cs to a differential signal cs_d_p, cs_d_n.

This conversion at converter 312 introduces a delay td_conv. The thus generated differential signal cs_d_p, cs_d_n is fed to the already mentioned differential amplifier 313. Differential amplifier 313 may have a similar or same design as a design of differential amplifier 34 and may introduce a delay td_diff which is substantially the same as the delay td_diff introduced by differential amplifier 34. As already explained, the output of differential amplifier 313 is then essentially forwarded to terminal 318 to be output as signal dig_cs. This forwarding via elements 314, 317 introduces a delay td_dig_cs which may be essentially the same as the delay td_dig_clk introduced for the clock signal.

Therefore, in the embodiment of FIG. 3, in the second mode, the delay introduced for the differential clock signal is td_diff+td_dig_clk, and the delay introduced for the single-ended signal (e.g. chip select) is td_conv+td_diff+td_dig_cs. Therefore, in embodiments the difference in time delays may essentially correspond to td_conv. In some embodiments, td_conv may be small (for example by a corresponding design of converter 312), which in embodiments may help to reduce the time delay difference and may, for example, help to assure a correct sampling of signal dig_cs based on signal dig_clk.

Next, with reference to FIG. 4, an example for a single-ended-to-differential converter 44, in the example shown a single-ended-to-low-voltage differential (LVD) converter according to some embodiments will be discussed. While a specific implementation of a single-ended-to-differential converter will be discussed in FIG. 4, this serves only for further illustration, and other single-ended-to-differential converters may also be used in other embodiments.

Figure 4:
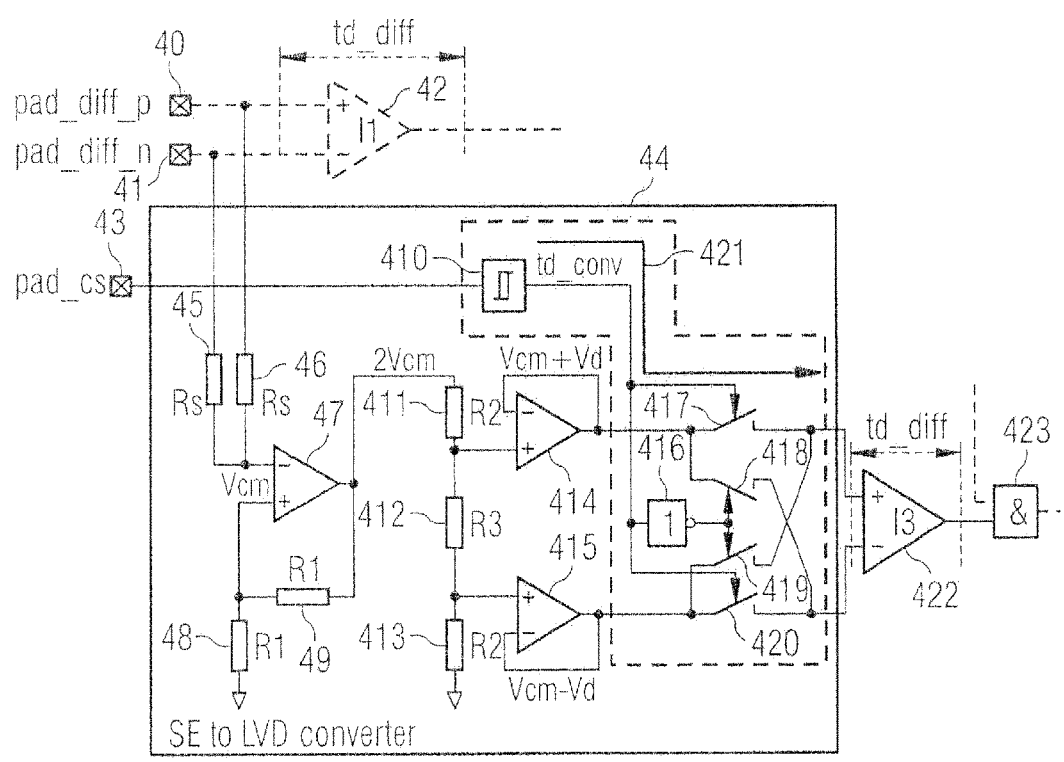
FIG. 4 is a diagram illustrating a single-ended-to-differential converter according to some embodiments.

In the embodiment of FIG. 4, pads 40, 41 serve to receive a differential signal, for example a differential clock signal, and may correspond to pads 32, 33 of FIG. 3, and an amplifier 42 serves to amplify the differential clock signal and may correspond to amplifier 34 of FIG. 3. A pad 43 in the example of FIG. 4 serves for receiving a single-ended signal, for example a single-ended chip select signal, and may correspond to pad 311 of FIG. 3. Single-ended chip select signal is then provided to single-ended-to-differential converter 44, which will be explained in more detail below and which may be an implementation example of converter 312 of FIG. 3, but may also be used in other embodiments. An output of converter 44 is provided to an amplifier 422, which may correspond to amplifier 313 of FIG. 3, and additionally an AND-gate 423 is illustrated at an output of amplifier 422 which may correspond to AND-gate 314 of FIG. 3. Other elements of the embodiment of FIG. 3 not explicitly illustrated in FIG. 4 may also be present in FIG. 4, and FIG. 4 focuses on a possible implementation of single-ended-to-differential converter 44.

For single-ended-to-differential conversion of the signal pad_cs received at pad 43, the signal is fed to a device like a Schmitt trigger 410 or other type of slicer having, for example, a defined threshold and defined hysteresis to provide a digital signal with two possible values. Based on this signal, switches 417 to 420 which are coupled as illustrated in FIG. 4 are controlled. In particular, switches 417 and 420 are controlled by the output signal of Schmitt trigger 410, such that they are closed when the chip select signal corresponds, for example, to a logic one and opened when the chip select signal corresponds to a logic zero. Switches 418 and 419 are controlled by the output signal of Schmitt trigger 410 after the output signal has been inverted by an inverter 416, such that switches 418, 419 are open when switches 417, 420 are closed and vice versa. Switches 417 and 418 are provided with a first voltage level by an amplifier 414, and switches 419, 420 are provided with a second voltage level by an amplifier 415. Therefore, depending on the state of the single-ended chip select signal, either the first voltage level is provided to the positive input of amplifier 422 and the second voltage level is provided to a negative input of amplifier 422 (when switches 417, 420 are closed), or the second voltage level is provided to the positive input of amplifier 422 and the first voltage level is provided to the negative input of amplifier 422 (in case switches 418, 419 are closed). In this way, a differential signal is provided to amplifier 422.

Furthermore, as will be explained next, converter 44 is adapted to provide the first and second voltage levels, such that a common mode voltage thereof corresponds to a common mode voltage of the differential clock signal provided to pads 40, 41. In this way, for example when converter 44 is used as converter 312 in FIG. 3, amplifiers 34, 313 are provided with signals having a same common mode voltage, which essentially corresponds to setting a same operating point for amplifiers 34, 313. This additionally may help to make the time delays introduced by amplifiers 34, 313 essentially the same.

To this end, the signals at pads 40, 41 in the embodiment of FIG. 4 are coupled to a positive input of an amplifier 47 via resistors 45, 46. An output of amplifier 47 is fed back to a negative input of amplifier 47 via a resistor 49. Furthermore, the negative input of amplifier 47 is coupled to ground via a resistor 48. Resistors 45 and 46 may have a same resistance value. Also, resistors 48 and 49 may have a same resistance value, although this need not be the case.

Furthermore, the output of amplifier 47 is provided to a resistive divider comprising resistors 411, 412, 413 coupled between the output of amplifier 47 and ground. Resistors 411, 413 may have a same resistance value, while resistor 412 may have a different resistance value compared to resistors 411, 413. Other configurations may also be possible. A node between resistors 411 and 412 is coupled with a positive input of the already mentioned amplifier 414, and an output of amplifier 414 is fed back to a negative input of amplifier 414. A node between resistors 412 and 413 is coupled to a positive input of amplifier 415, and an output of amplifier 415 is fed back to a negative input of amplifier 415.

To illustrate further, via resistors 45 and 46 a common-mode voltage Vcm of the differential signal at pads 40, 41 is provided to the positive input of amplifier 47. Amplifier 47 then outputs essentially two times this common-mode voltage Vcm. Through the use of resistive divider 411 to 413, amplifier 414 then outputs the common-mode voltage Vcm plus a differential voltage Vd, and amplifier 415 outputs the common-mode voltage Vcm minus the differential voltage Vd, such that signals output by converter 44 have the same common-mode voltage Vcm as the signal supplied to pads 40, 41. Other implementations may also be used.

Figure 5:
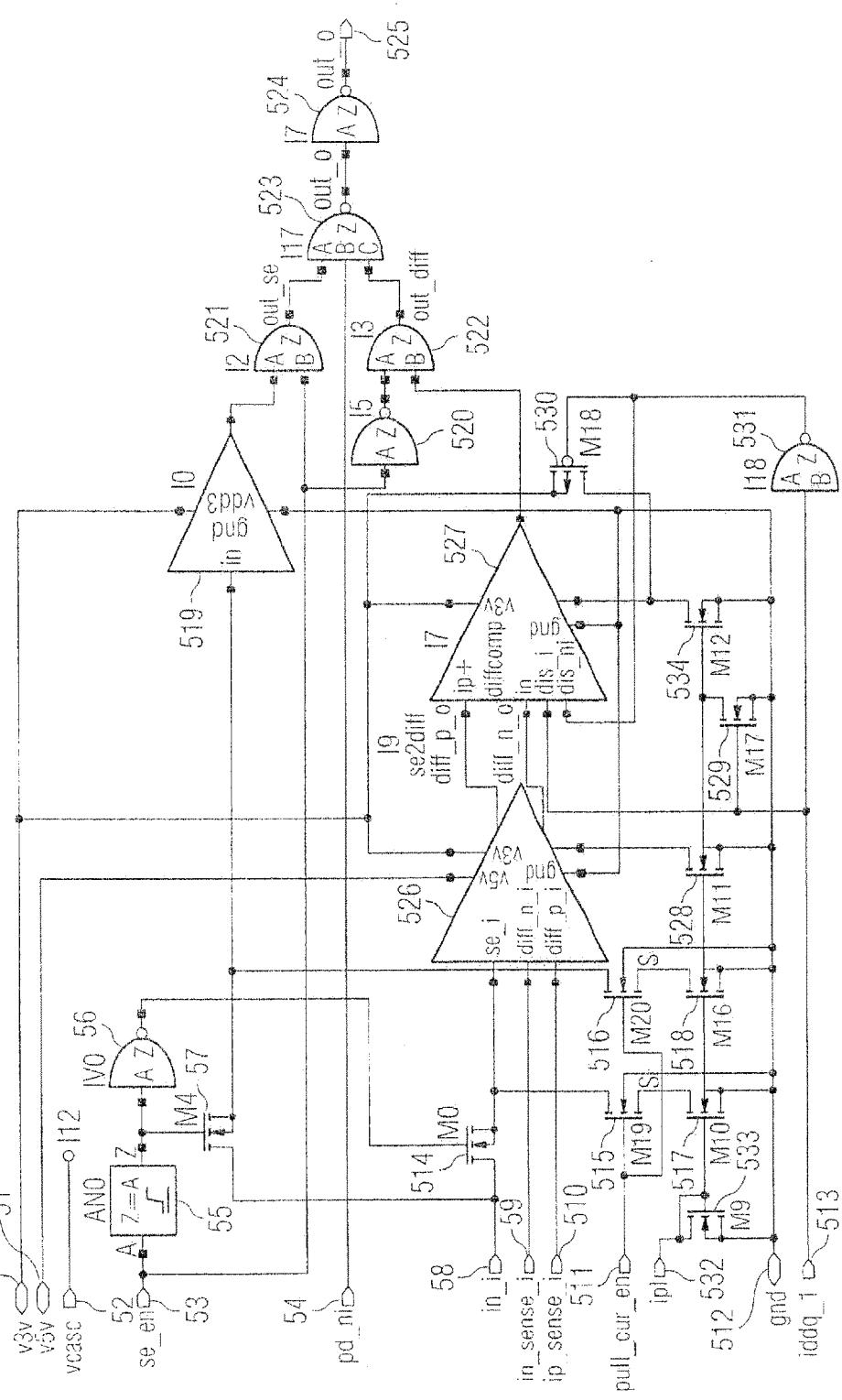
FIG. 5 is a circuit diagram illustrating an interface circuit according to an embodiment.

In FIG. 5, a circuit diagram illustrating an interface device according to a further embodiment is shown. While, in order to avoid repetitions in the description of similar elements, FIG. 5 will be explained referring to FIG. 3, it should be noted that the embodiment of FIG. 5 is independent from the embodiment of FIG. 3, and may be implemented using different devices or designs.

In the embodiments of FIGS. 5, 50 and 51 denote terminals for supplying a positive supply voltage. For example, in some implementations at terminal 50, a supply voltage of 3 V may be supplied, while at terminal 51, a supply voltage of 5 V may be supplied, although in other embodiments other voltages may also be used.

Furthermore, a terminal 52 may e.g. receive a further supply voltage, e.g. an auxiliary voltage.

A single-ended enable signal may be received at a terminal 53, essentially corresponding to the signal received by terminal 30 of FIG. 3. At a terminal 58, a single-ended signal, for example a chip select signal, may be received. In this respect, terminal 58 may correspond to pad 311 of FIG. 3. Terminals 59 and 510 serve to receive signals from a differential input like pads 32, 33, which signals may serve to adjust a common-mode voltage used in a single-ended-to-differential converter 526. A terminal 512 corresponds to a ground pin, and terminals 511, 513 and 532 may serve to input further control signals. For example, a signal at terminal 532 may be used to provide a bias current for other components in FIG. 5 (e.g. amplifier 527).

The single-ended signal received at terminal 58 is provided to a single-ended-to-differential converter 526 via a transistor 514. Furthermore, the single-ended signal is provided to an amplifier 519 via a transistor 57. The single-ended enable signal received at terminal 53 is provided to a gate terminal of transistor 57 via a level shifter 55 and further to an input of inverter 56. Therefore, transistor 57 enables or disables forwarding of the single-ended signal to amplifier 519, which, for example, may be implemented as a Schmitt trigger and may correspond to Schmitt trigger 315 of FIG. 3. Furthermore, the inverted version of the enable signal is coupled to a gate terminal of transistor 514 to selectively enable forwarding of the single-ended signal to single-ended-to-differential converter 526. Therefore, depending on a signal received at terminal 53, the single-ended signal received at terminal 58 is selectively either forwarded to amplifier 519 (for example if a clock signal or other differential signal is a differential signal) or to single-ended-to-differential converter 526 (in case a further signal, like a clock signal, is a differential signal).

An output signal of single-ended-to-differential converter is fed to a differential amplifier 527, which may correspond to amplifier 313 of FIG. 3 in some embodiments. 520 indicates a further inverter inverting the single-ended enable signal received at terminal 53, and an output of inverter 520 is fed to an input of an AND-gate 522. Likewise, the single-ended enable signal is also fed to an AND-gate 521. AND-gates 521, 522 may correspond to AND-gates 314 and 316 of FIG. 3. Furthermore, a NOR-gate 523 followed by an inverter 524 is provided essentially implementing the functionality of gate 317 of FIG. 3, with the additional possibility of controlling the output by a signal supplied to terminal 54, for example for testing purposes. Elements 533, 515, 516, 517, 518, 528, 529, 534 and 530 denote further transistors, some of which form current mirrors for providing a bias current, and 531 denotes a further inverter, which are coupled as illustrated in FIG. 5. The circuit implementation shown in FIG. 5 merely serves for illustrating a further possibility of an embodiment, and other circuit implementations are equally possible.

Figure 6:
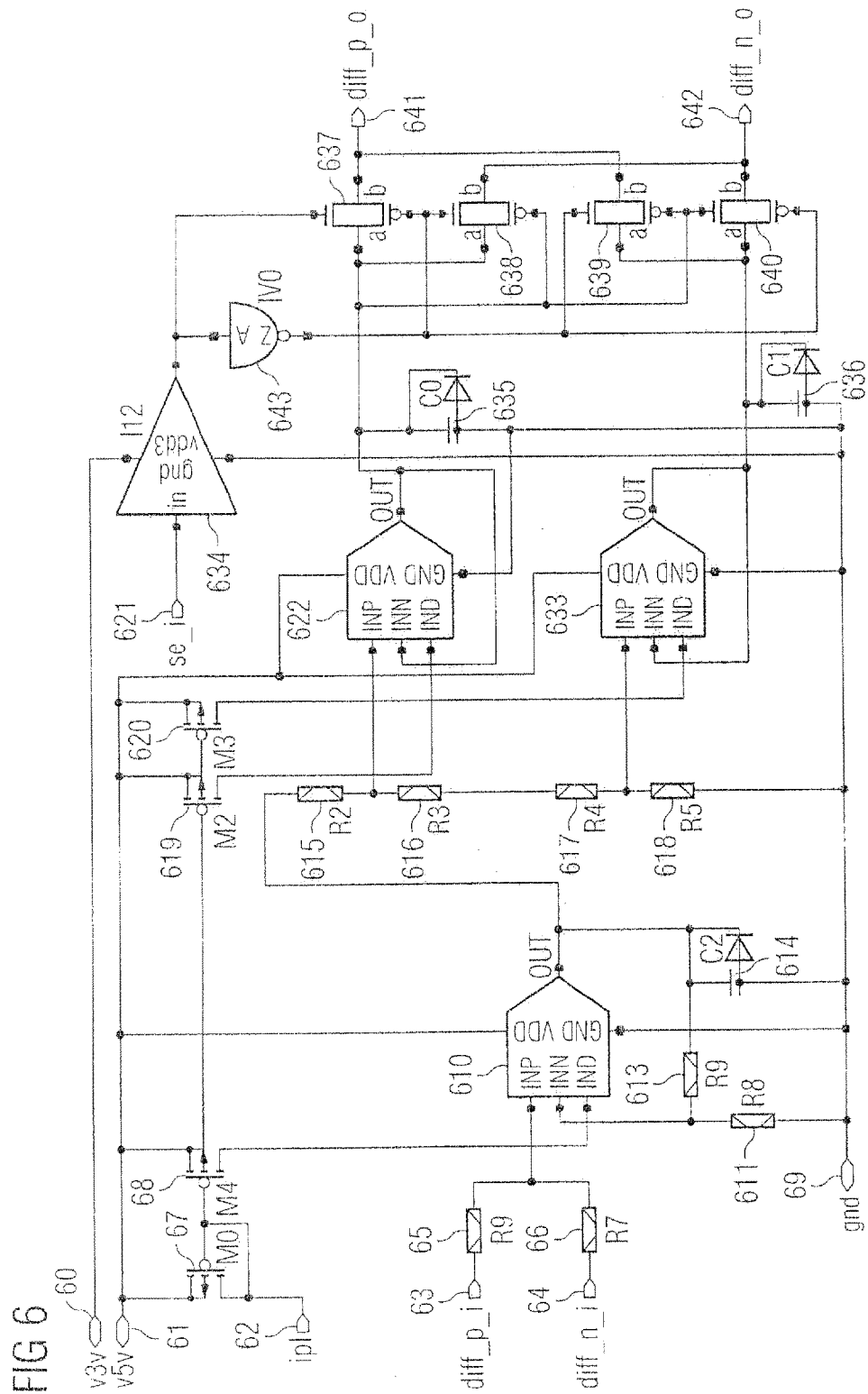
FIG. 6 is a circuit diagram illustrating a single-ended-to-differential converter according to some embodiments.

FIG. 6 illustrates a circuit diagram of a single-ended-to-differential converter according to a further embodiment. For example, FIG. 6 may represent an implementation of single-ended-to-differential converter 526 of FIG. 5. To avoid repetitions, the converter of FIG. 6 will be described referring to FIG. 4 in some instances. However, it is to be noted that FIG. 6 is an embodiment independent from the embodiment of FIG. 4.

In FIG. 6, terminals 60 and 61 may be terminals corresponding to terminals 50 and 51 of FIG. 5 to receive positive supply voltages, for example a positive supply voltage of 3 V at terminal 60 and a positive supply voltage of 5 V at terminal 61. Other voltages may also be used. 69 denotes a ground terminal, which may correspond to ground terminal 512 of FIG. 5. A terminal 62 may be used to provide a bias current for other components in FIG. 6 and may correspond to terminal 532 of FIG. 5.

The single-ended input signal is received at a terminal 621, which may correspond to an input terminal of single-ended-to-differential converter 526 coupled to terminal 58 via transistor 514 in FIG. 5. Moreover, the signals received at terminals 63, 64 are coupled to an amplifier 610 via resistors 65, 66. Resistors 65, 66 may, for example, correspond to resistors 45, 46 of FIG. 4 and amplifier 610 may correspond to amplifier 47 of FIG. 4. A negative input of amplifier 610 is coupled to ground via a resistor 611, which may correspond to resistor 48 of FIG. 4. Furthermore, a resistor 613 of FIG. 6 may correspond to resistor 49 of FIG. 4 and couples an output of amplifier 610 with a negative input of an amplifier 610.

A transistor 67 together with each one of transistors 68, 619 and 620 may form essentially current mirrors controlled by the signal at terminal 62. Reference numeral 614 denotes a capacitor providing a capacitive coupling of the output of amplifier 610 with ground.

An output of amplifier 610 is coupled with a resistive divider comprising resistors 615, 616, 617 and 618. Resistor 615 may correspond to resistors 411 of FIG. 4, resistors 616 and 617 may correspond to resistor 412 of FIG. 4, and resistor 618 may correspond to resistor 413 of FIG. 4. A node between resistor 615 and 616 is coupled to a positive input of amplifier 622, and a node between resistors 617 and 618 is coupled with a positive input of amplifier 633. An output of amplifier 622 is coupled with a negative input of amplifier 622, and an output of amplifier 633 is coupled with a negative input of amplifier 633. Amplifiers 622 and 633 may correspond to amplifiers 414, 415 of FIG. 4 and may supply signal levels for a differential signal to be generated having a common mode voltage corresponding to a common mode voltage of a differential signal received at terminals 63, 64.

The output of amplifier 622 is coupled capacitively with ground terminal 69 via a capacitor 635, and the output of amplifier 633 is capacitively coupled with ground terminal 69 via a capacitor 636.

To convert the single-ended signal received at terminal 622 to a differential signal, the circuit illustrated in FIG. 6 comprises a slicer 634, for example a Schmitt trigger or amplifier, which may correspond to amplifier 410 of FIG. 4 and which may be designed to introduce a small delay. Furthermore, switches 637 to 640 implemented as T-gates in the example of FIG. 6 are provided, which switches receive output signals from amplifiers 622, 633 and are controlled by an output signal of amplifier 634 directly and via an inverter 643. Switches 637 to 640 are, therefore, essentially controlled as was explained for switches 417 to 420 of FIG. 4 to convert the single-ended signal to a differential signal. The differential signal is then output at terminals 641, 642. While FIG. 6 illustrates a specific circuit implementation of a single-ended-to-differential converter usable in embodiments, the specific implementation is only given for illustration purposes, and in other embodiments other implementations of single-ended-to-differential converters may be employed.

Figure 7:
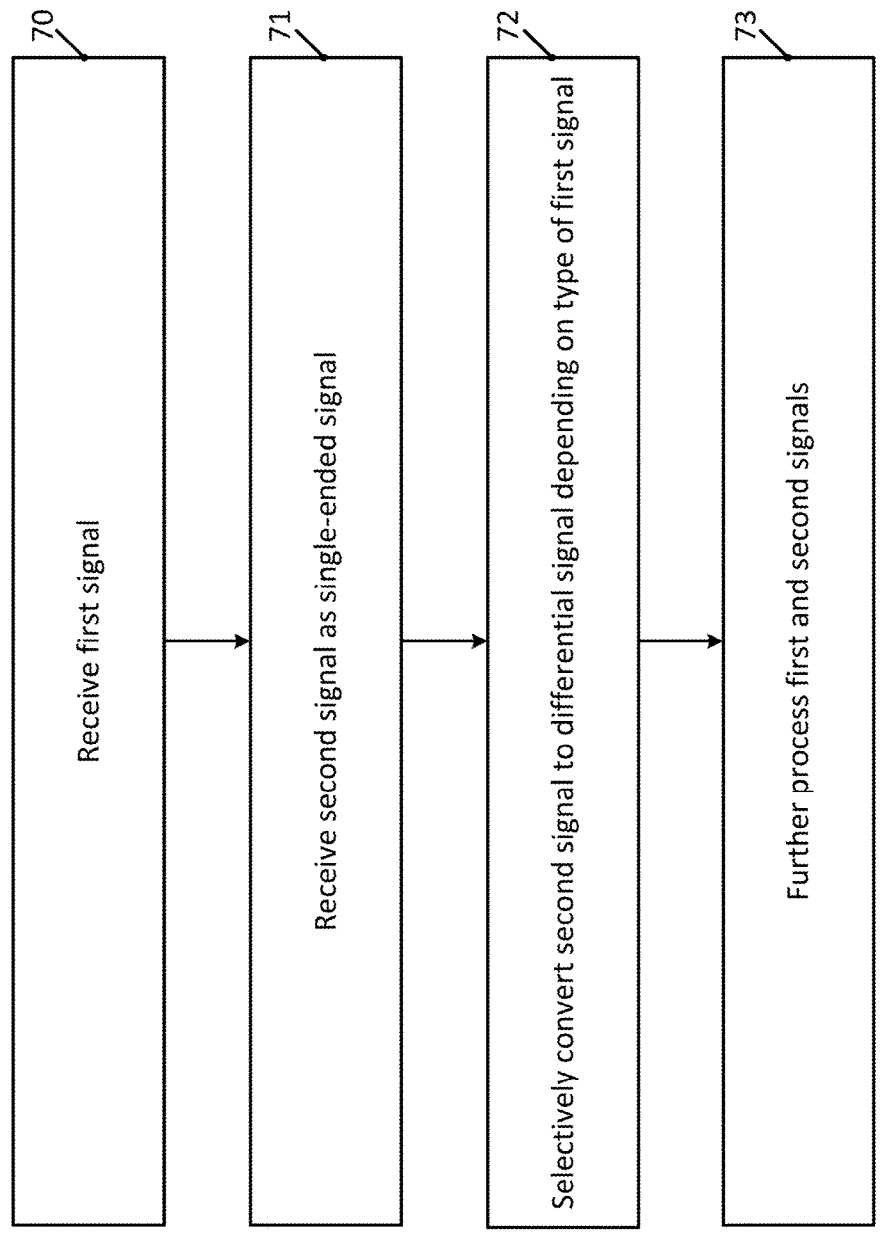
FIG. 7 is a flow chart illustrating a method according to an embodiment.

FIG. 7 illustrates a flow chart illustrating a method according to an embodiment. While the method of FIG. 7 is illustrated and will be described as a series of acts or events, the order in which theses acts or events are described is not to be construed as limiting. In other embodiments, acts or events may occur in a different order than shown, and/or some of the acts or events may be performed in parallel, for example by different parts of a circuit. The method of FIG. 7 may be implemented using devices and circuits as illustrated with respect to FIGS. 1 to 6, but is not limited thereto.

At 70, the method of FIG. 7 comprises receiving a first signal. The first signal may be either received as a single-ended signal or a differential signal, for example a low voltage differential signal. Furthermore, at 71, the method comprises receiving a second signal as a single-ended signal.

At 72, the method comprises selectively converting the second signal to a differential signal depending on the type of first signal. For example, the second signal may be converted to a differential signal, and/or the second signal may be used in a version converted to the differential signal, when the first signal is received as a differential signal, and not converted to a differential signal or further used as a single-ended signal in case the first signal is received as a single-ended signal.

In FIG. 7, the method may comprise further processing of the first and second signal (the second signal in the converted version of 72 in case a conversion has been performed or the converted signal is to be used). The further processing may be performed using similar circuits for the first and second signals to introduce the same or essentially the same delays.

Variations, modifications and details discussed with reference to FIGS. 1 to 6 may also be applicable to the method of FIG. 7 in a corresponding manner.

The above described embodiments serve only as examples for further illustration and are not to be construed as limiting.

What is claimed is:

1. An interface device, comprising:
a first input to receive a first signal,
a second input to receive a second signal,
a single-ended-to-differential converter coupled to the second input to provide a differential version of the second signal, and
a selection circuit adapted to selectively cause either the single-ended second signal or the differential version of the second signal to be used for further processing depending of a type of the first signal, wherein the selection circuit is adapted to select the single-ended second signal when the first signal is a single-ended signal and the differential version of the second signal when the first signal is a differential signal.

2. The device of claim 1, further comprising further processing circuitry to further process the first signal and the second signal, parts of the processing circuitry for processing the first signal having the same design as parts of the processing circuitry for further processing the second signal.

3. The device of claim 2, wherein the processing circuitry comprises at least one Schmitt trigger to process single-ended signals.

4. The device of claim 2, wherein the processing circuitry comprises at least one differential amplifier to process differential signals.

5. The device of claim 1, wherein the first input comprises a clock signal input.

6. The device of claim 1, wherein the second signal comprises a chip select signal.

7. The device of claim 1, wherein the selection circuit is adapted to selectively provide the second signal to the single-ended-to-differential converter.

8. The device of claim 1, wherein the single-ended-to-differential converter is coupled to the first input.

9. The device of claim 8, wherein the single-ended-to-differential converter is adapted to provide the differential version of the second signal with a common-mode voltage essentially equal to a common-mode voltage of the first signal.

10. The interface device of claim 1, wherein the interface device is a microsecond channel (MSC) interface device.

11. A method, comprising:
receiving a first signal,
receiving a second signal as a single-ended signal, and
selectively converting the second signal to a differential signal depending on a type of the first signal, wherein the selectively converting comprises converting the second signal to a differential signal if the first signal is a differential signal, and using the second signal as single-ended signal if the first signal is a single-ended signal.

12. The method of claim 11, further comprising processing the first and second signals based on processing circuits having essentially the same delay for the first and second signals.

13. The method of claim 11, wherein the selectively converting comprises providing a differential version of the second signal with a common-mode voltage equal to a common-mode voltage of the first signal.

14. The method of claim 11, wherein the first signal comprises a clock signal, and wherein the method further comprises sampling the second signal based on the first signal.

15. A device, comprising:
a pair of differential clock inputs,
a single-ended clock input,
a single-ended further input,
a first amplifier coupled to the differential clock input,
a first Schmitt trigger coupled to the single-ended clock input,
a single-ended-to-differential converter coupled to the single-ended further input,
a second amplifier coupled to an output of the single-ended-to-differential converter,
a second Schmitt trigger coupled to the single-ended further input, and
logic circuitry to selectively provide either a first output signal based on an output of the first amplifier and a second output signal based on an output of the second amplifier, or a first output signal based on an output signal of the first Schmitt trigger and a second output signal based on an output of the second Schmitt trigger at device output terminals.

16. The device of claim 15, wherein the first and second amplifiers have essentially the same design.

17. The device of claim 15, wherein the first and second Schmitt triggers have essentially the same design.

18. A method, comprising:
receiving a first signal, receiving a second signal as a single-ended signal,
selectively converting the second signal to a differential signal depending on a type of the first signal, wherein the selectively converting comprises converting the second signal to a differential signal if the first signal is a differential signal, and using the second signal as single-ended signal if the first signal is a single-ended signal,
wherein the first signal comprises a clock signal, and wherein the method further comprises sampling the second signal based on the first signal.

19. The method of claim 18, further comprising processing the first and second signals based on processing circuits having essentially the same delay for the first and second signals.

20. The method of claim 18, wherein the selectively converting comprises providing a differential version of the second signal with a common-mode voltage equal to a common-mode voltage of the first signal.

\* \* \* \* \*